United States Patent
Mao

(10) Patent No.: US 8,334,213 B2
(45) Date of Patent: Dec. 18, 2012

(54) BOTTOM ELECTRODE ETCHING PROCESS IN MRAM CELL

(75) Inventor: Guomin Mao, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 369 days.

(21) Appl. No.: 12/455,757

(22) Filed: Jun. 5, 2009

(65) Prior Publication Data
US 2010/0311243 A1 Dec. 9, 2010

(51) Int. Cl.
*H01L 21/302* (2006.01)
*B44C 1/22* (2006.01)

(52) U.S. Cl. .......................... 438/704; 216/22
(58) Field of Classification Search .................. None
See application file for complete search history.

(56) References Cited

U.S. PATENT DOCUMENTS

| | | | |
|---|---|---|---|
| 4,669,178 A * | 6/1987 | Johnson | 438/529 |
| 4,804,636 A * | 2/1989 | Groover et al. | 438/275 |
| 6,174,737 B1 | 1/2001 | Durlam et al. | |
| 6,806,096 B1 | 10/2004 | Kim et al. | |
| 7,211,447 B2 | 5/2007 | Horng et al. | |
| 7,335,960 B2 | 2/2008 | Han et al. | |
| 2007/0026665 A1* | 2/2007 | Bera et al. | 438/623 |
| 2007/0084829 A1* | 4/2007 | Hanson | 216/92 |
| 2007/0087522 A1* | 4/2007 | Nemani et al. | 438/424 |
| 2007/0224827 A1* | 9/2007 | Xiao et al. | 438/706 |
| 2007/0228006 A1* | 10/2007 | Kitamura | 216/58 |
| 2007/0272655 A1* | 11/2007 | Sakamoto et al. | 216/37 |
| 2007/0298619 A1* | 12/2007 | Yokoi et al. | 438/745 |
| 2008/0038673 A1* | 2/2008 | Nagaiwa et al. | 430/313 |
| 2008/0057838 A1* | 3/2008 | Huang et al. | 451/80 |
| 2008/0090307 A1 | 4/2008 | Xiao et al. | |
| 2009/0078927 A1 | 3/2009 | Xiao et al. | |

OTHER PUBLICATIONS

Kamal et al., "Enhancement of isopropanol-based photoresist removal by the addition of aqueous alkaline solutions", Apr. 2001, J. Vac. Sci. Techno. B, vol. 19, No. 2, pp. 461-466.*

Eon et al., "High density fluorocarbon plasma etching of methylsilsesquioxane SiOC(H) low-k material and Sic(H) etch stop layer: surface analyses and investigation of etch mechanisms", 2007, J. Phys. D: Appl. Phys., vol. 40, pp. 3951-3959.*

* cited by examiner

*Primary Examiner* — Shamim Ahmed
*Assistant Examiner* — Bradford Gates
(74) *Attorney, Agent, or Firm* — Saile Ackerman LLC; Stephen B. Ackerman

(57) ABSTRACT

A BE patterning scheme in a MRAM is disclosed that avoids damage to the MTJ array and underlying ILD layer while reducing BE-BE shorts and BE-bit line shorts. A protective dielectric layer is coated over a MTJ array before a photoresist layer is coated and patterned on the dielectric layer. The photoresist pattern is transferred through the dielectric layer with a dielectric etch process and then through the BE layer with a metal etch that includes a certain amount of overetch to remove metal residues. The photoresist is stripped with a sequence involving immersion or spraying with an organic solution followed by oxygen ashing to remove any other organic materials. Finally, a second wet strip is performed with a water based solution to provide a residue free substrate. In another embodiment, a bottom anti-reflective coating (BARC) is inserted between the photoresist and dielectric layer for improved critical dimension control.

20 Claims, 5 Drawing Sheets

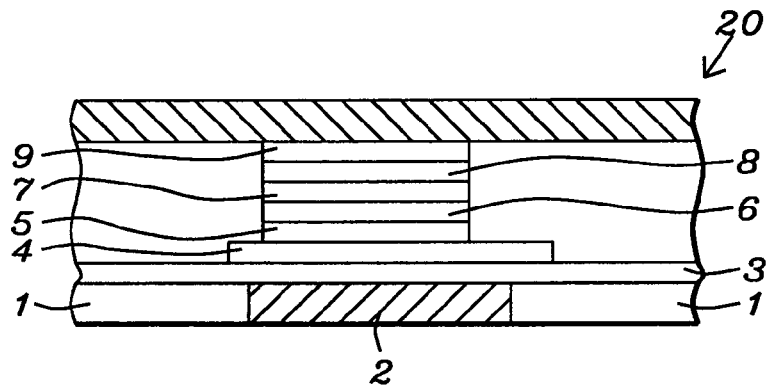
FIG. 1 – Prior Art
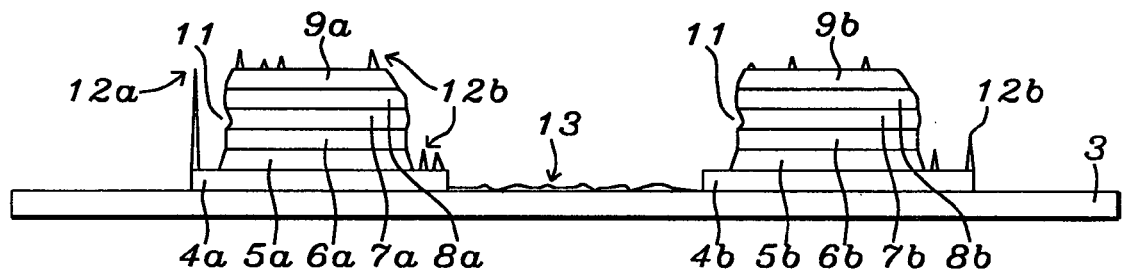
FIG. 2 – Prior Art
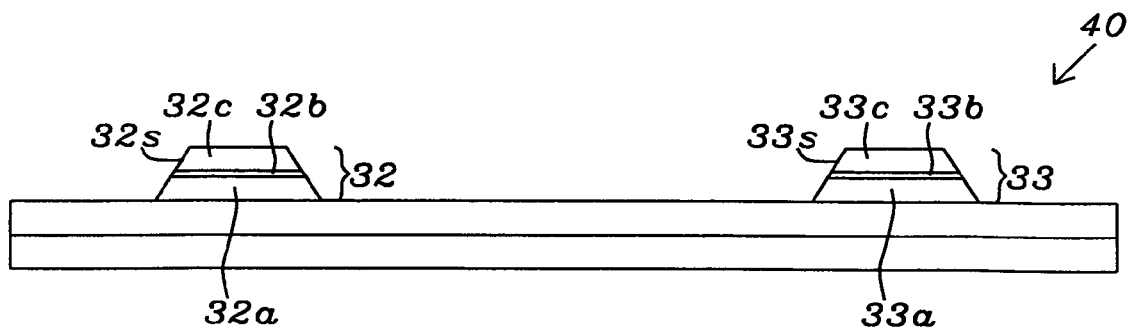
FIG. 3

BOTTOM ELECTRODE ETCHING PROCESS IN MRAM CELL

RELATED PATENT APPLICATION

This application is related to the following: U.S. Patent Application Publication 2008/0090307; and U.S. Patent Application Publication 2009/0078927, both assigned to a common assignee and herein incorporated by reference in their entirety.

FIELD OF THE INVENTION

The invention relates to a method of patterning a bottom electrode (BE) during fabrication of a MRAM cell, and in particular to a process sequence that eliminates BE-BE shorts, BE-bit line shorts, and prevents damage to magnetic tunnel junction (MTJ) sidewalls during etching and cleaning steps.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, Flash, etc. A MRAM device is generally comprised of an array of parallel first conductive lines on a horizontal plane, an array of parallel second conductive lines on a second horizontal plane spaced above and formed in a direction perpendicular to the first conductive lines, and an MTJ element interposed between a first conductive line and a second conductive line at each crossover location. A first conductive line may be a word line while a second conductive line is a bit line or vice versa. Alternatively, a first conductive line may be a bottom electrode that is a sectioned line while a second conductive line is a bit line (or word line). Typically, there are other devices including transistors and diodes below the array of first conductive lines as well as peripheral circuits used to select certain MRAM cells within the MRAM array for read or write operations.

A MTJ element may be based on a tunneling magneto-resistance (TMR) effect wherein a stack of layers has a configuration in which two ferromagnetic layers are separated by a thin non-magnetic dielectric layer. A MTJ stack of layers may be formed in a so-called bottom spin valve configuration by sequentially depositing a seed layer, an anti-ferromagnetic (AFM) pinning layer, a ferromagnetic "pinned" layer, a thin tunnel barrier layer, a ferromagnetic "free" layer, and a capping layer on a substrate.

The AFM layer holds the magnetic moment of the pinned layer in a fixed direction. The pinned layer has a magnetic moment that is fixed in the "y" direction, for example, by exchange coupling with the adjacent AFM layer. The free layer has a magnetic moment that is either parallel or anti-parallel to the magnetic moment in the pinned layer and is preferably made of NiFe because of its reproducible and reliable switching characteristics as demonstrated by a low switching field (Hc) and switching field uniformity (σHc). The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("0" memory state) and a higher resistance is noted when they are in an anti-parallel state or "1" memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. In certain MRAM architectures, the top electrode or the bottom electrode participates in both read and write operations.

Generally, the purpose of the capping layer is to protect underlying layers in the MTJ during etching and other process steps and to function as an electrical contact to an overlying conductive line. In the fabrication of MRAM devices, ion beam etching (IBE) is often used to create MTJ cell arrays. However, IBE typically produces sloped sidewalls on the MTJ cell such that the top surface (capping layer) has a smaller width than the bottom surface (seed layer). A sloped profile can not only lead to electrical shorting issues but also limits further reduction of linewidth and makes it impossible to manufacture a very high density IC device as is required for applications such as spin torque MRAM. A better approach to create a well defined three dimensional micro feature is by reactive ion etch (RIE) where a chemical reaction enables easy removal of by-products formed through the interaction of gaseous reactants and the materials to be removed. In the current MRAM fabrication process, a heavy metal such as Ta is deposited on top of a MTJ stack of layers, and acts both as a hard mask for the etching of the MTJ stack and also as an interlayer conduction channel to the top bit line.

FIG. 1 depicts a conventional MRAM cell 20 in which a MTJ element comprised of layers 5-9 is sandwiched between a bottom electrode 4 and a bit line (BL) 10 that contacts a top surface of the cap layer 9 in the MTJ stack of layers. An AFM layer 5, pinned layer 6, tunnel barrier 7, and free layer 8 are sequentially formed on bottom electrode layer 4. Bottom electrode 4 is formed on an insulation layer dielectric (ILD) 3 which is disposed on substrate comprised of word line 2 and insulation layer 1.

Referring to FIG. 2, a typical MRAM fabrication process includes patterning the MTJ stack of layers 5-9 and then patterning the bottom electrode layer 4 to form separate bottom electrodes 4a, 4b for MTJ elements comprised of layers 5a-9a and layers 5b-9b, respectively, in order to electrically separate the two MRAM cells in the drawing. One reason for concern with the prior art process is a BE etch following the MTJ patterning step commonly exposes the sides of layers 5a-9a and the sides of layers 5b-9b to etching plasma that can easily cause damage to the aforementioned MTJ layers as indicated by the gouge 11 along a side of layers 7a, 7b. As a result, MTJ performance will be degraded. Secondly, the BE layer 4 typically includes at least one metal layer and metal etching can readily produce non-volatile by-products that have a tendency to redeposit as defects 12a, 12b on bottom electrodes 4a, 4b and cap layers 9a, 9b. In some cases, a defect 12a formed on bottom electrode 4a (or 4b) has a large enough height to touch a subsequently deposited bit line (not shown) and cause a BL-BE short. Another shortcoming of standard MRAM fabrication schemes is that some regions of the ILD may be etched during BE patterning to an extent that the remaining ILD 3 is too thin or penetrated completely thereby damaging an underlying word line. On the other hand, if the BE etch process is too mild, significant amounts of BE residue 13 may remain between bottom electrodes 4a, 4b and cause a BE-BE short. Therefore, a BE patterning method is needed which avoids the problems of BE-BE shorting, BE-BL shorting, and damage to MTJ sidewalls which are limiting factors in current fabrication methods.

In U.S. Pat. No. 6,806,096, an insulating mask made of silicon nitride or silicon oxide is deposited on a patterned MTJ element, followed by depositing a BARC coating and an overlying photoresist. The photoresist is patterned and then the pattern is transferred through the BARC with an ARC open step. Then a separate RIE process is used to pattern the insulating hard mask. In a third RIE step, the hard mask pattern is transferred through the bottom electrode layer. The method does not teach an overetch treatment of the BE layer to minimize metal residue and does not include a process for removing the photoresist and BARC coatings to avoid defects.

U.S. Pat. No. 7,211,447 describes patterning a photoresist layer that has been formed over a MTJ element, performing a reactive ion etch (RIE) to transfer the pattern through a bottom electrode, and then stripping the photoresist. The method of photoresist removal is not specified and an anti-reflective layer or hard mask is not employed.

In U.S. Patent Appl. Publications 2008/0090307 and 2009/0078927, a conformal coating of silicon oxide or silicon nitride is formed over a patterned MTJ prior to patterning an overlying photoresist and then etching a bottom electrode layer. Again, there is no teaching with regard to an anti-reflective layer between the conformal coating and the photoresist layer and no discussion related to minimizing defects during the BE patterning and photoresist removal steps.

U.S. Pat. No. 7,335,960 discloses the formation of a sacrificial layer of metal, SiC, silicon oxide, or silicon nitride on a MTJ stack but the sacrificial material is applied before the MTJ is patterned.

U.S. Pat. No. 6,174,737 shows a MRAM fabrication sequence but does not go into detail when describing a process for patterning a bottom electrode layer.

SUMMARY OF THE INVENTION

One objective of the present invention is to provide a method of patterning a bottom electrode layer in a MRAM cell such that the MTJ element therein is not damaged by wet and dry process steps during the bottom electrode patterning sequence.

A second objective of the present invention is to provide a method of patterning a bottom electrode layer in a MRAM cell that essentially eliminates metal residues formed during the patterning sequence thereby substantially reducing BE-BE shorts and BE-BL shorts and improving device yield.

These objectives are achieved by providing a substrate comprised of a bottom electrode layer that is overlaid on an insulation layer dielectric (ILD). The ILD layer is typically formed on a substrate that usually includes an array of word lines formed within an insulation layer. The bottom electrode layer is connected by vias in the insulation layer to an array of transistors below the word line array. An array of MTJ cells is formed by first depositing a stack of MTJ layers on the bottom electrode layer. In one aspect, the MTJ stack has a bottom spin valve configuration in which a seed layer, AFM layer, synthetic anti-ferromagnetic (SyAF) pinned layer, tunnel barrier layer, free layer, and capping layer or hard mask are sequentially formed on the bottom electrode layer. Once all the layers in the stack are laid down and thermally annealed to fix the pinned layer magnetization direction, a patterning and etching sequence is employed to form a MTJ array.

According to a first embodiment of the present invention, a conformal dielectric layer is deposited on the array of MTJ cells to protect the MTJ layers therein from subsequent plasma and wet process steps. A bottom anti-reflection coating (BARC) and a photoresist layer are sequentially formed on the protective dielectric layer. A lithography process is used to form a photoresist mask pattern and then a first plasma etch step is employed to remove exposed portions of the BARC layer. A second etch step in a dielectric etching chamber removes regions of the protective dielectric layer exposed by openings in the photoresist/BARC stack.

Next, the bottom electrode (BE) layer is etched in a metal etch chamber. It is important that the BE etching includes a certain amount of overetch to remove any BE residues that result from non-uniformity in the BE layer thickness and non-uniformity in the etching process. Because of limited etch selectivity between the BE material and the ILD material, a top portion of the ILD layer is removed in exposed regions during the BE etch process. However, ILD thinning may be controlled by the appropriate choice of BE etch conditions.

After RIE etching, the remaining photoresist mask is removed in a wet stripping tool. The cleaning process is another important feature since certain metal residues and metal-photoresist complexes can only be removed by inserting a wet cleaning step before the standard dry cleaning step. Otherwise, a process flow involving a dry stripping step before a first wet stripping causes metal residues (fences) to form that are essentially non-removable by a subsequent wet treatment without damaging the ILD layer. The initial wet clean step with an organic solvent removes the photoresist and typically most of the BARC layer. Preferably, the wet clean is followed by a dry stripping process in a dry plasma chamber to remove any BARC residues. Thereafter, a second wet cleaning step with a water based solution is used to strip any residues formed by plasma etching the residual BARC layer. As a result, adjacent bottom electrodes are well isolated with no BE residues to cause BE-BE shorting and the MTJ is intact and free from plasma etch damage due to the protective dielectric layer. Furthermore, BE residues are stripped by the wet/dry/wet sequence to prevent BE shorting to subsequently deposited bit lines.

In a second embodiment, a dielectric anti-reflective coating (DARC) which combines the features of an oxide or nitride hard mask with an anti-reflective property is formed on the array of MTJ cells. Thereafter, a photoresist layer is coated on the DARC layer and patterned as in the first embodiment to form an opening between adjacent MTJ cells. Next, a first etch step is performed in a dielectric etch chamber to remove a region of the DARC layer exposed by the opening. The substrate is moved to a metal etch chamber where the BE layer is etched to form a bottom electrode below each MTJ cell. A certain amount of overetch is important to remove BE metal residues that have a tendency to form during the main portion of the BE etch before end point is reached. A wet strip is employed to remove the remaining photoresist layer. In some cases, a thin organic residue may stay on the DARC layer so a dry strip followed by a second wet strip process is preferred to ensure that the DARC surface is clean. The second embodiment represents a cost savings in that fewer process steps are required during the BE patterning sequence.

A third embodiment is comprised of a protective layer on the MTJ cells that is made of two spin-on hard mask layers. First, a bottom layer made of a carbon spin-on hard mask (C-SOH) is formed on the MTJ cells and on the BE layer between adjacent MTJs. Then a silicon containing spin-on hardmask (Si-SOH) is coated on the C-SOH. Thereafter, a photoresist is coated and patterned on the Si-SOH. The pattern is transferred through the Si-SOH layer with a first dielectric etch and through the C-SOH with a second dielectric etch. Next, the pattern is transferred through the BE layer with a metal etch. A wet-dry-wet stripping sequence is employed as in the first two embodiments to remove the photoresist layer and strip any residues from the surface of the protective dielectric layer (C-SOH/Si-SOH).

In all embodiments, the BE patterning sequence is typically followed by deposition of an insulation layer to fill the space between adjacent MTJ cells. Thereafter, a chemical mechanical polish step may be used to planarize the insulation layer to become coplanar with the top layer in the MTJ cells. Subsequently, an array of bit lines is formed within a second insulation layer above the array of MTJ cells.

BRIEF DESCRIPTION OF THE DRAWINGS

FIG. 1 is a cross-sectional view of a conventional MRAM cell having a MTJ element formed between a bottom electrode and an overlying bit line.

FIG. 2 is a cross-sectional view of a MRAM cell that shows defects resulting from a bottom electrode patterning process according to a prior art method.

FIGS. 3-10 are cross-sectional views showing a BE patterning sequence in a MRAM structure according to a first embodiment of the present invention.

DETAILED DESCRIPTION OF THE INVENTION

Figure 4:
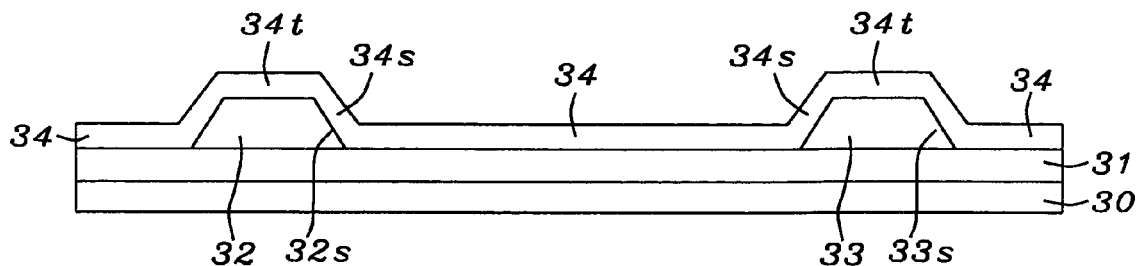

The present invention is a process sequence for patterning a bottom electrode layer in a MRAM cell that avoids the formation of BE-BE shorts, BE-bit line shorts, and damage to the MTJ element within the MRAM cell. The present invention encompasses various MTJ configurations such as bottom spin valve, top spin valve, and multi-layer spin valve structures. We have found that the BE process sequence is as critical as the selection of materials for various MRAM layers in optimizing device performance.

Referring to FIG. 3, a cross-sectional view of a partially completed MRAM structure 40 is shown that includes two MTJ elements 32, 33 formed on a bottom electrode layer 31, typically with a thickness from 100 to 600 Angstroms. BE layer 31 is disposed on an ILD layer 30 having a thickness in the range of 200 to 800 Angstroms. It should be understood that the MRAM structure 40 comprises a plurality of MTJ elements but only two MTJ elements are depicted in order to simplify the drawing. Furthermore, BE layer 31 may be a composite of two or more layers and preferably contains at least one metal layer that serves as a conductive layer. Note that BE layer 31 is connected by one or more vias (not shown) to devices such as transistors in a sub-structure below ILD layer 30. After the bottom electrode patterning process is completed, each MTJ 32, 33 will be electrically connected through a bottom electrode and a via to an underlying transistor.

It should be understood that the MRAM structure 40 is part of an MRAM array in which multiple parallel word lines are formed in a first conductive layer (not shown) below the BE layer 31 and multiple top conductor electrodes such as parallel bit lines are formed in a second conductive layer above an array of MTJs as described in a later section. In the exemplary embodiment, a MTJ element is formed between a bottom electrode and a bit line at each location where a bit line crosses over a word line.

MTJ 32 is comprised of a bottom portion 32a that contacts BE layer 31, a middle tunnel barrier layer 32b, and an upper portion 32c that includes a free layer and capping layer. Bottom portion 32a may be a stack of layers comprising a lower seed layer, a middle AFM layer, and an upper pinned layer, for example. Likewise, MTJ 33 is comprised of a bottom portion 33a equivalent to layer 32a, middle tunnel barrier layer 33b, and an upper portion 33c equivalent to upper portion 32c.

All of the layers in the MTJs 32, 33 are formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom conductor layer 31 and overlying MTJ layers may be formed after a single pump down of the sputter system to enhance throughput. After the MTJ stack of layers including a capping layer or composite hard mask have been deposited, one or more annealing steps may be employed to set the magnetization direction of the pinned layer in the lower portions 32a, 33a. For example, in the exemplary embodiment, the MTJ stack of layers including the composite hard mask may be annealed in a vacuum by applying a magnetic field of 10K Oe in magnitude along the y-axis (easy axis) for 1 to 5 hours at a temperature of about 250° C. to 360° C. An annealing step comprising a magnetic field applied along the hard axis may also be performed.

MTJs 32, 33 and other MTJ elements in the MRAM array may be patterned by a method disclosed in related U.S. Patent Application Publication 2009/0078927 which is herein incorporated by reference in its entirety. However, alternative MTJ patterning methods may be employed. The distance between adjacent MTJ elements 32, 33 varies depending upon the MRAM layout, and the slope of sidewalls 32s, 33s may vary from a shallow slope as indicated in FIG. 3 to a more vertical profile. From a top-view (not shown), MTJs 32, 33 may have a circular, elliptical, or a polygonal shape as appreciated by those skilled in the art.

Returning to FIG. 4, a first step in the bottom electrode patterning sequence of the present invention is deposition of a protective dielectric film 34 on bottom electrode layer 31 and on the MTJ array including MTJs 32, 33. The dielectric film 34 may be deposited by a chemical vapor deposition (CVD) method, for example, and preferably has a thickness of 200 to 1000 Angstroms. In one aspect, when silicon nitride or silicon oxide is selected as the dielectric film 34, the resulting film may be conformal with the substrate surface. In other words, the thickness of regions 34t and 34s along the top and sidewalls, respectively, of MTJs 32, 33 may be essentially equal to the thickness of regions of dielectric layer 34 formed between adjacent MTJ elements. In an alternative embodiment, other dielectric materials used in the industry may be selected for dielectric layer 34. However, dielectric layer 34 must have a low enough electrical conductivity to function as an insulator material, and sufficient etch selectivity during BE layer 31 etching so that the remaining dielectric layer thickness after BE etching is thick enough to protect the MTJs 32, 33 from damage during subsequent plasma etching and wet processes. In one aspect, dielectric layer 34 serves as a hard mask during BE layer 31 etching to provide better controlled critical dimension (CD) uniformity and profile shape in opening 37 (FIG. 5).

In one embodiment (not shown) where the BE patterning scheme involves the generation of a large opening in the BE layer 31 to produce adjacent bottom electrodes, a thick photoresist layer may be coated directly on dielectric layer 34. Then, the photoresist layer having a plurality of openings therein is employed as a mask in a subsequent etch step which transfers the openings through exposed regions of dielectric layer 34 in a dielectric etch chamber and then through exposed regions of bottom electrode layer 31 in a metal etch chamber to create a plurality of bottom electrodes. In general, for current technology nodes of 300 nm or smaller, some type of anti-reflective coating is required below the photoresist layer in order to adequately control the size of small openings formed during the imaging (patterning) step.

Figure 5:
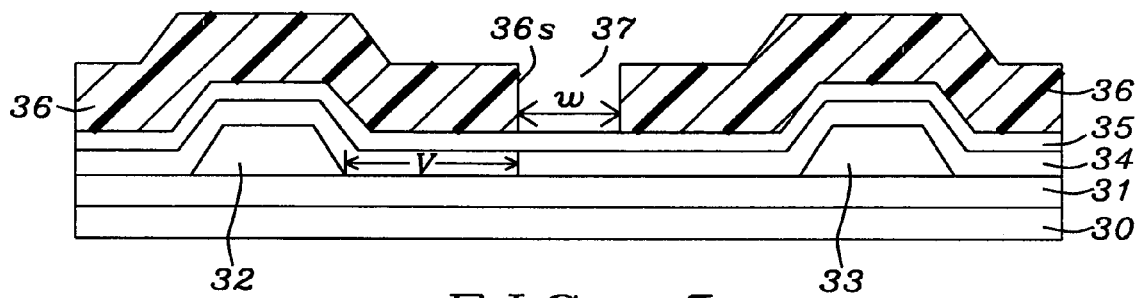

Referring to FIG. 5, a first embodiment is depicted where a thin photoresist layer is required to print small openings for advanced technology nodes of about 300 nm or less. In this case, a bottom anti-reflective coating (BARC) 35 is preferably coated on the dielectric layer 34 before the photoresist layer 36 is coated and patterned. It should be understood that a significant portion of photoresist layer 36 is consumed during the pattern transfer process through dielectric layer 34 and a BARC layer is necessary to control the width w of opening 37 during subsequent etching steps. Thus, a first etch step requires transferring the photoresist pattern through the BARC layer 35. In the absence of a BARC layer, the width $w_1$ of opening 37a (FIG. 6) etched in the dielectric layer 34 and eventually $w_2$ in opening 37b of bottom electrode layer 31 (FIG. 7) is likely to be much greater than w. The distance v between MTJs 32, 33 and sidewalls 36s must be maintained within a certain value to control device performance.

In the exemplary embodiment, BARC coating 35 is an organic material comprised of a polymer that is crosslinked during a bake (curing) step following a spin coat application. Preferably, there is no intermixing of layers when photoresist 36 is coated on BARC 35 since the BARC curing step renders the anti-reflective layer inert to organic solvents. In an alternative embodiment, the BARC coating may be photosensitive and a developable BARC known as a D-BARC in the industry. Thus, the photoresist layer 36 and D-BARC layer 35 are simultaneously exposed and then developed in aqueous base to form an opening that extends through exposed regions of the D-BARC. As a result, there is no need to etch transfer the pattern in the photoresist layer through the BARC layer. Subsequent process steps required to pattern the dielectric layer 34 and BE layer 31 are the same whether the anti-reflective layer is a standard BARC or a D-BARC.

Figure 6:
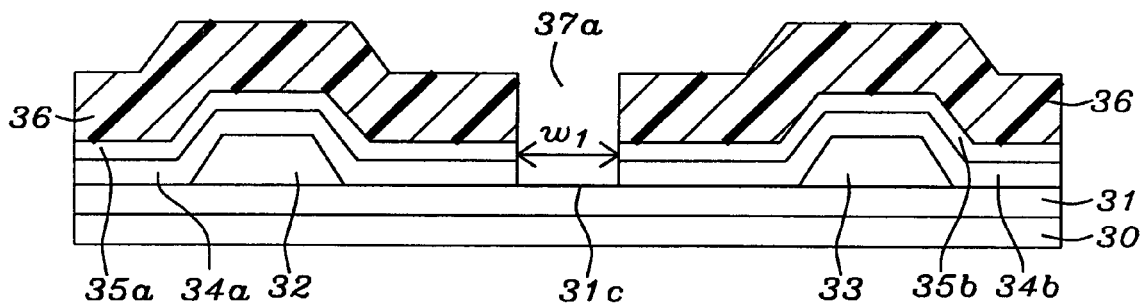

Referring to the exemplary embodiment in FIG. 6, the opening 37 in photoresist layer 36 is transferred through BARC layer 35 by a first reactive ion etch (RIE) step in a dry etching chamber. For example, the BARC layer 35 may be etched in a dielectric etching chamber of a Centura Enabler Etch system from Applied Materials, Inc. using a process involving a blend of fluorocarbon and $N_2$ gases with flow rates of 20 to 200 standard cubic centimeters per minute (sccm) and 0 to 200 sccm, respectively, a pressure from about 20 to 250 mTorr, and a bias power in the range of 100 to 800 Watts. A preferred method comprises 80 sccm $CF_4$, 80 sccm $N_2$, 80 mTorr pressure, and 400 Watt bias power to remove the exposed regions of BARC layer 35 at a rate of about 1500 Angstroms per minute with a 2.6% uniformity (1σ). Moreover, the same BARC etch process may be extended to remove exposed regions of protective dielectric layer 34 to form opening 37a. A typical silicon oxide removal rate under the BARC etch conditions is about 400 to 2000 Angstroms per minute.

As a result, a stack including lower dielectric layer 34a, middle BARC layer 35a, and photoresist layer 36 is formed adjacent to MTJ 32 and a stack comprised of lower dielectric layer 34b, middle BARC layer 35b, and upper photoresist layer 36 is formed adjacent to MTJ 33. Note that the width w of original opening 37 may change by a certain amount after the first etch step such that opening 37a has a width $w_1$ which is greater or smaller than w depending on whether the sidewalls 36s are etched in a lateral direction or fluorocarbon polymer is deposited on the surface of sidewalls 36s to effectively shrink the opening. The present invention also encompasses a sequence wherein the BARC layer 35 is etched in a first dry etch chamber and the dielectric layer 34 is etched in a second dry etch chamber or dielectric etch chamber.

Figure 7:
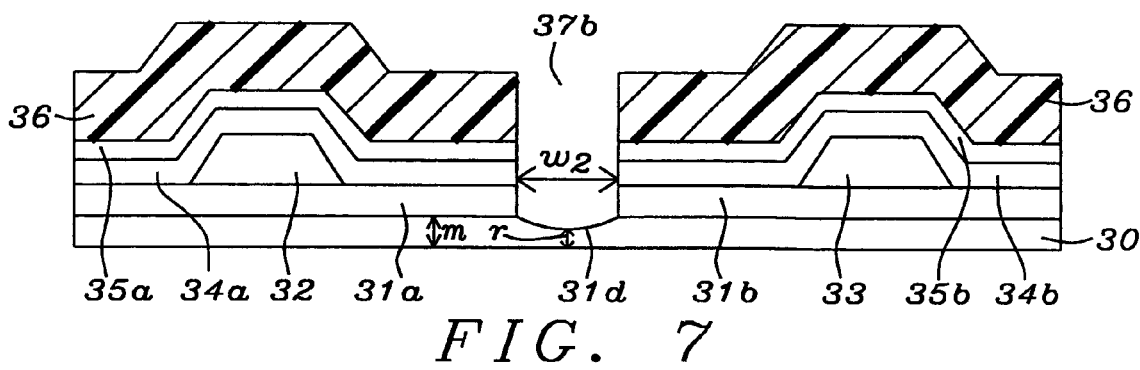

Referring to FIG. 7, the substrate with the partially formed MRAM structure in FIG. 6 is transferred to a metal etch chamber. Thereafter, the opening 37a is transferred through bottom electrode layer 31 to form a new opening 37b having width $w_2$ by a metal etch process. For example, the BE layer 31 may be etched in a DPS-II system from Applied Materials, Inc. using a process involving a blend of $Cl_2$ and $N_2$ gases with a flow rate from 20 to 120 sccm and 10 to 80 sccm, respectively, a pressure between 3 and 20 mTorr, a bias power from 20 to 100 Watts, and a source power between 500 and 1600 Watts. In another aspect, $Cl_2$ may be replaced by another halogen containing gas, and another nitrogen containing gas may substitute for $N_2$. A preferred method comprises 60 sccm $Cl_2$, 45 sccm $N_2$, 5 mTorr pressure, 50 Watt bias power, and 1200 Watt source power. In an embodiment where the BE layer 31 comprises a Ta layer, Ta is removed using these conditions at a rate of about 1200 Angstroms per minute with a 3.3% uniformity (1σ).

Endpoint for the removal of BE layer 31 in opening 37a may be tracked by measuring a change in intensity of a reactive gas species using optical emission spectroscopy that may involve monitoring a signal based on an emission in the infrared to UV range. Preferably, BE etch is extended beyond endpoint by a certain percentage to ensure that BE material which is redeposited on photoresist layer 36 or in opening 37b is removed thereby preventing unwanted metal from causing BE-BL shorts or BE-BE shorts, respectively. The amount of overetch is determined by the etch rate uniformity and selectivity of BE layer 31 to ILD layer 30. We found that 50% overetch is the maximum amount needed to remove all metal residues. Prolonging the overetch beyond 50% is usually undesirable since excessive ILD loss is likely to occur. In some cases by proceeding beyond 50% overetch, a hole (not shown) may be punched through ILD 30 and cause erosion of word line metal (not shown) and device yield degradation.

As a result of the preferred BE etch scheme that involves less than about 50% overetch, a groove 31d is formed at the base of opening 37b and the thickness r of ILD layer 30 below opening 37b is less than a thickness m below MTJs 32, 33. By using the aforementioned BE etch conditions, the ILD thickness loss in opening 37b is about 50 Angstroms. Thus, for an embodiment where ILD thickness is relatively thick at greater than about 300 Angstroms, there is sufficient ILD layer 30 remaining below opening 37b to guarantee that underlying word lines will not be attacked during subsequent processes that involve plasma etch or wet chemical treatments. However, in an embodiment in which ILD thickness is substantially less than 300 Angstroms or when overetch is extended beyond 50%, higher selectivity of BE metal to ILD material is necessary. Therefore, the present invention also anticipates that the BE etch process conditions described earlier may be modified to provide a higher etch selectivity than about 2.5:1 BE/ILD when Ta is employed as the BE layer 31 and silicon nitride is the ILD layer 30. Accordingly, one or more of the gas composition, flow rate, or bias/source power may be adjusted to generate a higher etch rate of BE layer 31 relative to ILD layer 30.

The material for dielectric layer 34 is chosen so that selectivity to BE layer is high which means a minimal loss of dielectric layer 34 thickness adjacent to MTJs 32, 33 during removal of BE layer 31 in opening 37b. In an embodiment in which the dielectric layer 34 is made of silicon oxide and BE layer 31 comprises Ta, the Ta to oxide selectivity is more than 2 which is acceptable for most MRAM fabrication schemes.

Figure 8:
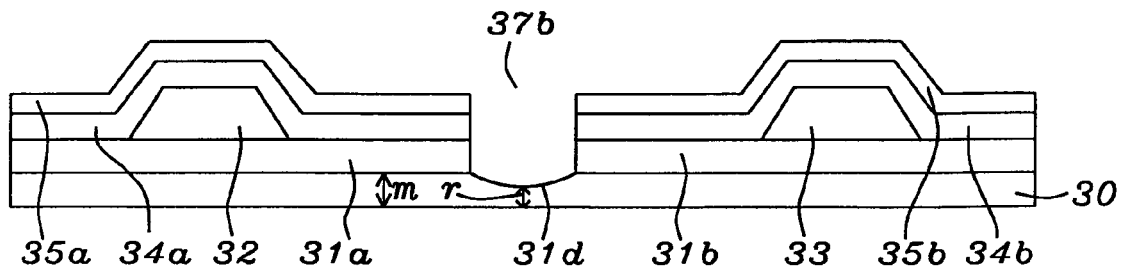
Figure 9:
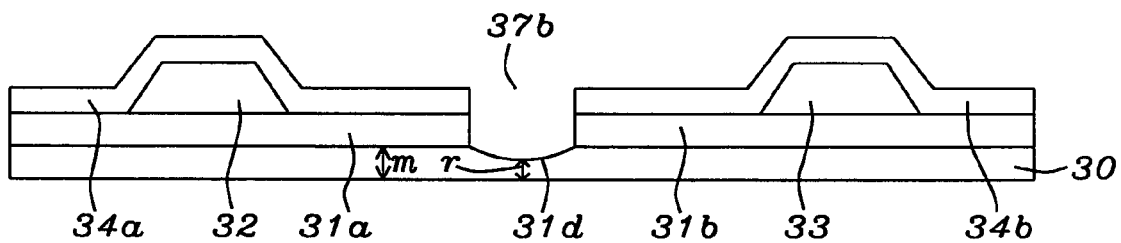

Referring to FIGS. 8-9, another key feature of the first embodiment is the process sequence for removing photoresist layer 36 and BARC layer 35a, 35b adjacent to MTJs 32, 33, respectively. In prior art, patterned photoresist layers in a MRAM fabrication scheme are generally stripped after BE etching by applying an oxygen ashing method in a dry etch chamber. Unfortunately, treating the photoresist layer by a dry stripping method does not remove redeposited metal or metal complexes with photoresist. Instead, the metal residues tend to reside on the dielectric layer after the photoresist and BARC are removed, especially along the edge of the dielectric layer mask and frequently take the form of a linear shape or "fence" that is practically impossible to remove in a subsequent wet strip without damaging the underlying ILD layer 30. We have discovered that by inserting a wet stripping step before the dry strip process, the metal complexes and fence can be removed without harming the ILD layer 30 or dielectric layer 34a, 34b.

In one aspect, an initial wet stripping process removes the photoresist layer 36 and a portion of BARC 35a, 35b. Furthermore, a dry stripping process following the wet strip is preferred since the wet strip usually does not remove the entire BARC layer 35 because it is a hardened "crosslinked" organic layer. Thereafter, a second wet stripping step is used to remove any residues formed by the dry stripping process. Thus, a three step stripping sequence involving a wet, dry, wet process flow is critical in achieving a residue free substrate to avoid BE-BE shorts and BE-BL shorts.

In one embodiment, the first wet strip process comprises removing the photoresist layer 36 and at least a substantial portion of the BARC layer 35a, 35b by treatment with an organic solution containing one or more organic solvents. As an example, NMP solution applied at a temperature between about 60° C. and 90° C. is effective as the first wet stripper. In one example, the first wet strip is performed in a spray chamber within a Raider mainframe made by Semitool, Inc. During an experiment that involved spray applying NMP at 75° C., there was no ILD layer 30 thickness loss and no thinning of dielectric layer 34a, 34b after a typical period of 120 to 240 seconds in the spray chamber.

The dry stripping step may be performed in an oxygen plasma chamber, ASP II from Applied Materials, Inc. for example, to remove BARC 35 and photoresist 36 residues from the first wet strip process. Thickness loss to dielectric layer 34a, 34b is negligible in the dry stripping step that comprises oxygen ashing. Next, the second wet stripping step preferably comprises treatment with ST250, a water based cleaning solution, at a temperature between 30° C. and 50° C., and preferably 40° C., for 90 to 180 seconds to remove any residues remaining on dielectric layer 34a, 34b or within opening 37b. In one example, the second wet stripping step is performed in a Capsule chamber within a Raider mainframe from Semitool, Inc. In another embodiment, a conventional EKC cleaning process at a slightly elevated temperature between 60° C. and 90° C. may be employed for the second wet stripping step. It should be understood that the first and second wet stripping steps typically include an initial exposure of the substrate to the stripping solution by a spray or immersion application followed by rinsing with deionized water and then spin drying.

Figure 10:
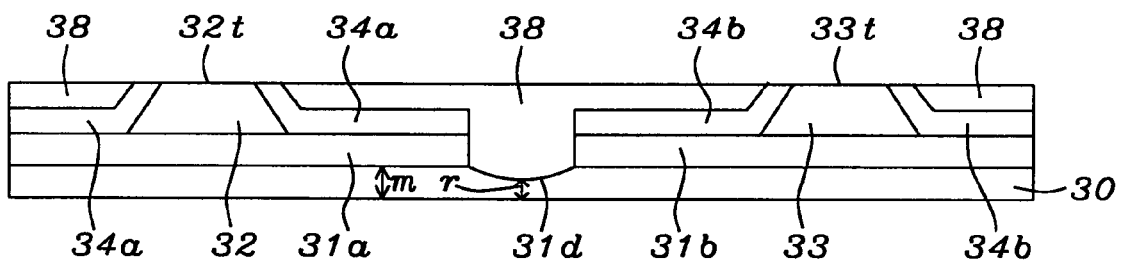

Referring to FIG. 10, bottom electrodes 31a, 31b (and MTJs 32, 33) are electrically isolated from each other and from other bottom electrodes formed in the MRAM array following the three step stripping process described previously. In one embodiment, the next step in MRAM fabrication comprises deposition of an insulation layer 38 such as silicon oxide to fill opening 37b. Thereafter, a CMP process may be employed to make the insulation layer 38 coplanar with a top surface of MTJs 32, 33. An array of bit lines (not shown) may then be formed on insulation layer 38 such that a bit line contacts MTJ 32 and MTJ 33. The BL process and subsequent MRAM fabrication steps are well known to those skilled in the art and are not described herein.

Figure 11:
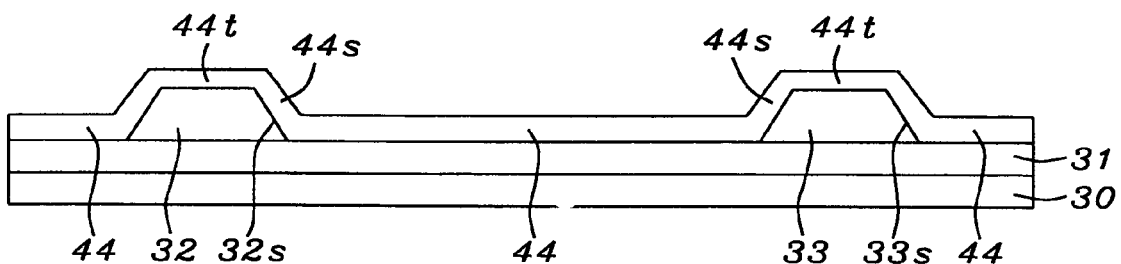
FIGS. 11-15 are cross-sectional views illustrating a BE patterning sequence in a MRAM structure according to a second embodiment of the present invention.

In a second embodiment depicted in FIG. 11, a dielectric anti-reflective coating (DARC) 44 is deposited on MTJs 32, 33 and on BE layer 31. In one aspect, the DARC layer is formed by a CVD method. DARC combines the features of a hard mask (protective dielectric layer) and an anti-reflective film in a single coating that may be comprised of silicon oxynitride, for example. As a single layer, DARC layer 44 replaces two layer stack configuration (BARC 35/dielectric layer 34) in the first embodiment. When CVD or plasma enhanced CVD is employed as a deposition method, the DARC forms an essentially conformal layer such that the thickness of section 44t above MTJs 32, 33 and section 44s along the sidewalls 32s, 33s is approximately the same as the thickness of the section of DARC layer 44 which contacts the BE layer 31.

Figure 12:
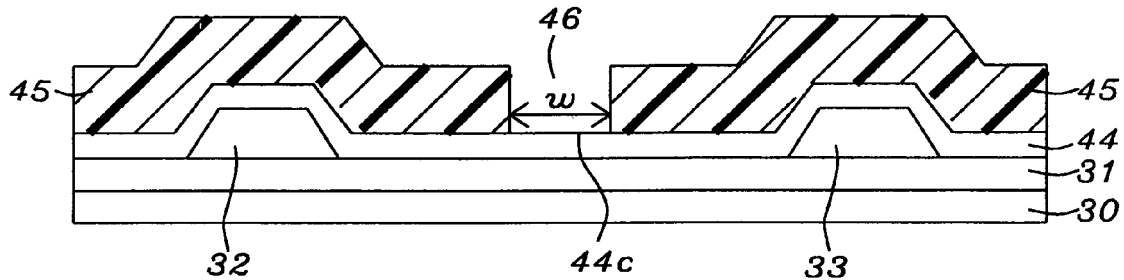

Referring to FIG. 12, a photoresist layer 45 is coated on DARC layer 44 and patterned to form an opening 46 that exposes a top DARC surface 44c between MTJs 32, 33. The width w of the opening is well controlled by proper matching of n and k optical values for DARC 44 with n and k properties of the photoresist layer 45 as appreciated by those skilled in the art. The width w is dependent on photoresist layer 45 thickness. As the width w decreases for advanced MRAM devices, photoresist layer 45 thickness must also decrease in order to achieve a large enough process window for satisfactory critical dimension control.

Figure 13:
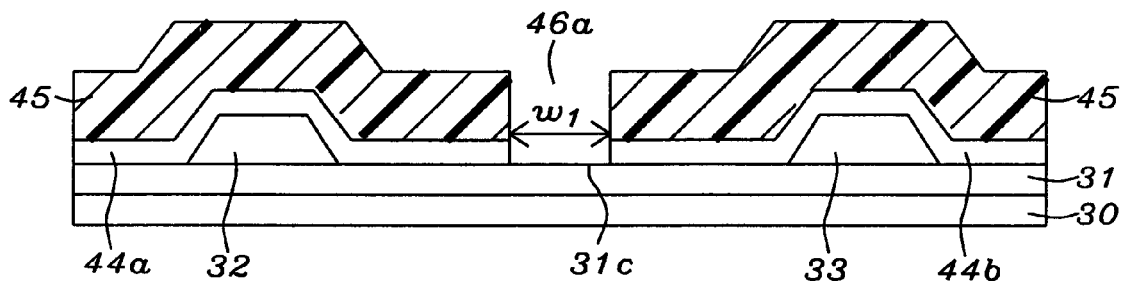

Referring to FIG. 13, opening 46 is transferred through DARC 44 by a dry etch process in a dielectric etch chamber to form an opening 46a having a width $w_1$. In one aspect, the BARC/dielectric layer etch described in the first embodiment may be employed for this step. Opening 46a exposes a portion 31c of BE layer 31. As a result, DARC layer 44a adjacent to MTJ 32 is separated from DARC layer 44b adjacent to MTJ 33.

Figure 14:
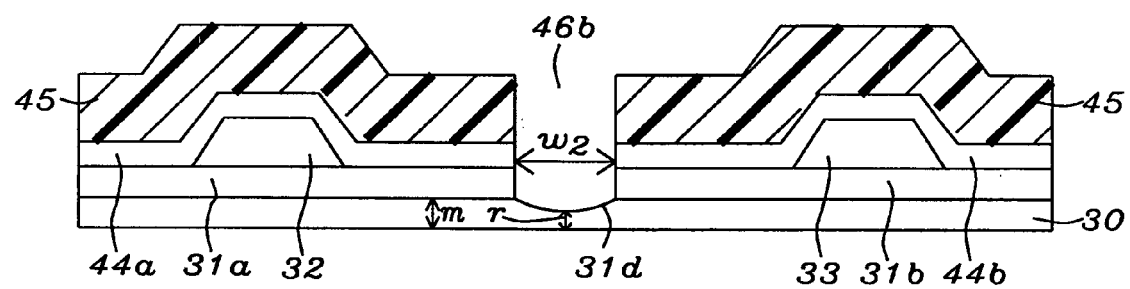

In the following step depicted in FIG. 14, opening 46a is transferred through the BE layer 31. Photoresist layer 45 and DARC layers 44a, 44b serve as an etch mask for the etch step which preferably occurs in a metal etch chamber. For example, the same BE etching process described in the first embodiment may be used for this step that forms opening 46b having a width $w_2$. As mentioned earlier, the BE layer 31 etch preferably includes an overetch of up to 50% to ensure the removal of any metal residues that deposit on photoresist layer 45 or within opening 46b. Moreover, the BE etch process may require modification as indicated previously to achieve a higher selectivity of BE layer 31 to ILD layer 30 so that the thickness r of ILD layer below opening 46b does not become so thin that holes are punched through to underlying word line metal (not shown) by the etch gas.

Figure 15:
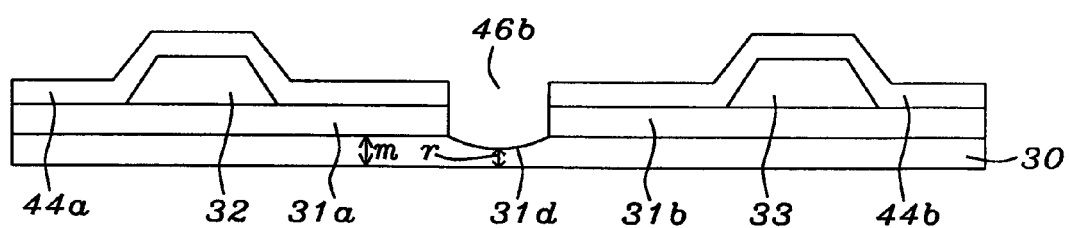

Referring to FIG. 15, a wet, dry, wet stripping sequence as described in the first embodiment is preferred to remove the photoresist layer 45 and clean the surface of DARC layers 44a, 44b as well as opening 46b. The first wet stripping step with organic solvent removes any metal residues and metal-photoresist complexes while the dry stripping step removes residues not dissolved or washed away in the previous step. However, a dry etching process typically introduces oxide residues that may be non-volatile. Therefore, the second wet stripping treatment with a water based solution is employed to remove any residues generated during the previous oxygen ashing step.

Figure 16:
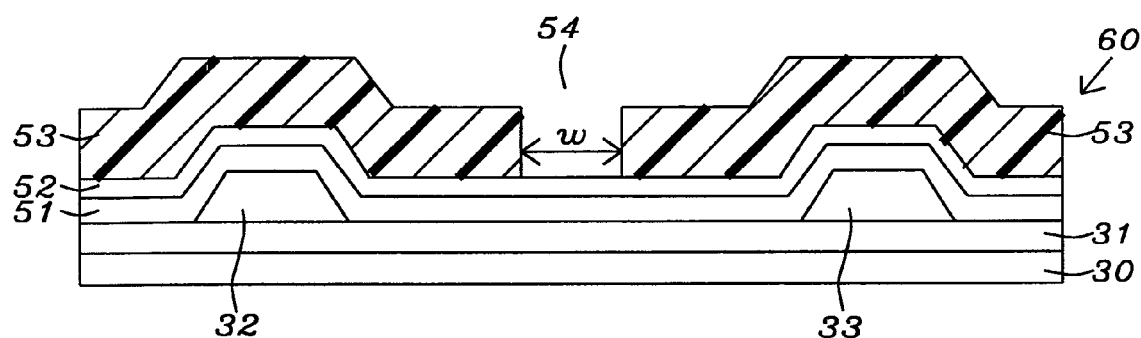
FIGS. 16-17 are cross-sectional views depicting a BE patterning sequence in a partially formed MRAM structure according to a third embodiment of the present invention.
Figure 17:
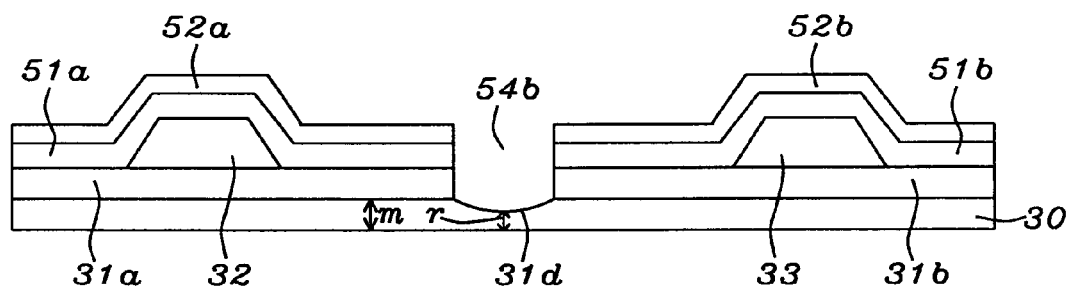

In a third embodiment depicted in FIGS. 16-17, the BE patterning stack including a dielectric layer/BARC/photoresist configuration (first embodiment) or DARC/photoresist configuration (second embodiment) is replaced by a stack comprised entirely of spin-on materials. In one aspect, the trilayer stack of the third embodiment includes a lower spin-on hard mask with high carbon content (C-SOH), a middle silicon containing spin-on hard mask (Si-SOH), and an upper photoresist layer. A C-SOH solution is available from AZ Electronic Materials or JSR Microelectronics and a Si-SOH material may be obtained from Honeywell Electronic Materials. Optionally, a BARC layer may be inserted between the Si-SOH layer and photoresist but is not necessary when the C-SOH and Si-SOH layers have the required anti-reflective property to provide linewidth control during patterning of the photoresist layer. In general, a dual anti-reflective stack as represented by C-SOH/Si-SOH enables enhanced anti-reflective control over a single BARC or DARC layer and is less expensive than CVD deposited hard mask films. However, the spin-on hard mask technology is less mature than CVD hard masks and has a tendency to introduce more coating defects. As the spin-on hard mask materials are optimized, the dual SOH approach as described herein is expected to be more compatible with high throughput manufacturing schemes.

Referring to FIG. 16, a partially formed MRAM structure 60 is shown according to a third embodiment of the present invention and is similar to MRAM structure 40 described in the first embodiment except that a trilayer stack comprised of a lower C-SOH 51, middle Si-SOH 52, and an uppermost photoresist layer 53 are formed on the MTJs 32, 33 and on BE layer 31 by a series of spin coatings and bake steps as appreciated by those skilled in the art. Photoresist layer 53 is patterned by a conventional method to generate a plurality of openings including opening 54 between MTJ 32 and MTJ 33. Reflectivity control is provided by C-SOH 51 and Si-SOH 52 and the thicknesses of the aforementioned layers may be varied to tune the n and k optical constants and optimize the anti-reflective property therein.

Referring to FIG. 17, two different etch steps are required to transfer the pattern in photoresist layer 53 through Si-SOH 52 and C-SOH 51. Preferably, a fluorocarbon containing etch such as the BARC etch described in the first embodiment is employed to transfer the pattern through Si-SOH 52 and stop on C-SOH 51. Thereafter, a second etch step preferably comprised of an oxygen plasma is used to transfer the pattern through C-SOH 51. Note that oxygen plasma etches C-SOH at a significantly faster rate than Si-SOH and therefore enables a high selectivity of C-SOH to Si-SOH for this step.

At this point, the substrate with partially formed MRAM structure 60 is transferred to a metal etch chamber and a metal etch process sequence as mentioned previously with respect to the first embodiment is followed. In particular, opening 54b is transferred through BE layer 31 and then an overetch of up to 50% is applied to ensure that essentially all metal residue is removed from photoresist layer 53 and from within opening 54b. Thereafter, the wet, dry, wet stripping sequence described previously is followed. First, a wet organic stripping process removes photoresist layer 53, metal residue, and metal-photoresist complexes. Then, a dry oxygen ashing is used to clean the surface of Si-SOH 52. A small amount of Si-SOH may be etched during the oxygen ashing since this silicon containing layer has a very low etch rate in $O_2$ plasma. Finally, a second wet step comprising a water based cleaning solution such as ST250 is employed to remove any non-volatile residues from the previous dry stripping step.

The present invention offers a complete process flow for patterning a bottom electrode layer from the point of MTJ patterning up to the bit line fabrication that has not been disclosed in the prior art to our knowledge. In particular, the use of a protective dielectric layer on the MTJs in addition to the series of etching steps and cleaning steps are necessary to avoid BE-BE and BE-BL defects required for good MRAM manufacturing yields and high device performance in advanced technology products. A certain amount of BE layer overetch is necessary to eliminate a substantial amount of metal residue before the wet stripping process begins. A wet strip involving an organic solvent prior to an oxygen ashing step is critical for removing metal residue and metal-photoresist complexes that otherwise would be practically impossible to remove by a conventional dry process without damaging the underlying ILD layer. Furthermore, a wet cleaning step with a water based solution is essential in removing non-volatile residues following the dry stripping step.

While this invention has been particularly shown and described with reference to, the preferred embodiment thereof, it will be understood by those skilled in the art that various changes in form and details may be made without departing from the spirit and scope of this invention.

I claim:

1. A method of patterning a bottom electrode layer in a MRAM structure, said bottom electrode layer is formed on a substrate including an insulation layer dielectric (ILD), comprising:
    (a) providing an array of MTJ elements on said bottom electrode layer wherein each of said MTJ elements has a bottom portion contacting the bottom electrode layer, a top portion having a top surface, and sidewalls connecting said top surface to the bottom electrode layer;
    (b) forming a protective dielectric layer that serves as a hard mask on the top surface and sidewalls of the MTJ elements and on the bottom electrode layer between adjacent MTJ elements;
    (c) forming a stack of layers on the protective dielectric layer, comprising:
        (1) a bottom anti-reflective coating (BARC) which contacts the protective dielectric layer; and
        (2) a photoresist layer on the BARC layer;
    (d) patterning the photoresist layer to form a plurality of openings between adjacent MTJ elements;
    (e) transferring said plurality of openings through the BARC layer and through the protective dielectric layer with a dielectric etch process;
    (f) transferring said plurality of openings through the bottom electrode layer with a metal etch process to form a patterned bottom electrode below each of said plurality of MTJ elements, said metal etch includes a certain amount of overetching that removes a top portion of the ILD at the bottom of each of the plurality of openings; and (g) removing the photoresist and BARC layers following the metal etch through the bottom electrode, the photoresist and BARC are removed with a stripping process that is a sequence of wet, dry, and wet stripping methods, comprising:
  (1) a first method which is a first wet strip that includes immersing or spraying the substrate with a solution including one or more organic solvents;
  (2) a dry ashing step following the first wet strip that includes exposing the substrate to an $O_2$ plasma; and
  (3) a second wet strip following the dry ashing step that includes treatment of the substrate with a water based solution.

2. The method of claim 1 wherein the protective dielectric layer has a thickness between about 200 and 1000 Angstroms.

3. The method of claim 1 wherein the bottom electrode layer is comprised of Ta and has a thickness from about 100 to 600 Angstroms.

4. The method of claim 1 wherein transferring the plurality of openings through the BARC layer and dielectric layer is performed in a dielectric etch chamber with a process comprising a fluorocarbon gas flow rate of about 20 to 200 standard cubic centimeters per minute (sccm), a $N_2$ flow rate between 0 and about 200 sccm, a pressure from about 20 to 250 mTorr, and a bias power in the range of about 100 to 800 Watts.

5. The method of claim 1 wherein transferring the plurality of openings through the bottom electrode layer is performed in a metal etch chamber with a process comprising a $Cl_2$ flow rate of about 20 to 120 sccm, a $N_2$ flow rate between about 10 and 80 sccm, a pressure from about 3 to 20 mTorr, a bias power in the range of about 20 to 100 Watts, and a source power from about 500 to 1600 Watts.

6. The method of claim 1 wherein the first wet strip consists of applying NMP maintained at a temperature between about 60° C. and 90° C.

7. The method of claim 1 wherein the second wet strip comprises a water based cleaning solution maintained at a temperature of about 30° C. to 50° C.

8. A method of patterning a bottom electrode layer in a MRAM structure, said bottom electrode layer is formed on a substrate including an insulation layer dielectric (ILD), comprising:
  (a) providing an array of MTJ elements on said bottom electrode layer wherein each of said MTJ elements has a bottom portion contacting the bottom electrode layer, a top portion having a top surface, and sidewalls connecting said top surface to the bottom electrode layer;
  (b) forming a dielectric anti-reflective coating (DARC) that also serves as a hard mask on the top surface and sidewalls of the MTJ elements and on the bottom electrode layer between adjacent MTJ elements;
  (c) forming a photoresist layer on the DARC layer;
  (d) patterning the photoresist layer to form a plurality of openings wherein there is an opening between adjacent MTJ elements;
  (e) transferring said plurality of openings through the DARC layer with a dielectric etch process;
  (f) transferring said plurality of openings through the bottom electrode layer with a metal etch process to form a patterned bottom electrode below each of the MTJ elements in said array, said metal etch includes a certain amount of overetch to remove a top portion of the ILD at the bottom of each of the plurality of openings; and
  (g) removing the photoresist layer following the metal etch through the bottom electrode, the photoresist layer is removed with a stripping process that is a sequence of wet, dry, and wet stripping methods, comprising:
    (1) a first method which is a first wet strip that includes immersing or spraying the substrate with a solution including one or more organic solvents;
    (2) a dry ashing step following the first wet strip that includes exposing the substrate to an $O_2$ plasma; and
    (3) a second wet strip following the dry ashing step that includes treatment of the substrate with a water based solution.

9. The method of claim 8 wherein the DARC is comprised of silicon oxynitride.

10. The method of claim 8 wherein the bottom electrode layer is comprised of Ta and has a thickness from about 100 to 600 Angstroms.

11. The method of claim 8 wherein transferring the plurality of openings through the DARC layer is performed in a dielectric etch chamber with a process comprising a fluorocarbon gas flow rate of about 20 to 200 standard cubic centimeters per minute (sccm), a $N_2$ flow rate between 0 and about 200 sccm, a pressure from about 20 to 250 mTorr, and a bias power in the range of about 100 to 800 Watts.

12. The method of claim 8 wherein transferring the plurality of openings through the bottom electrode layer is performed in a metal etch chamber with a process comprising a $Cl_2$ flow rate of about 20 to 120 sccm, a $N_2$ flow rate between about 10 and 80 sccm, a pressure from about 3 to 20 mTorr, a bias power in the range of about 20 to 100 Watts, and a source power from about 500 to 1600 Watts.

13. The method of claim 8 wherein the first wet strip consists of applying NMP maintained at a temperature between about 60° C. and 90° C.

14. The method of claim 8 wherein the second wet strip comprises a water based cleaning solution maintained at a temperature of about 30° C. to 50° C.

15. A method of patterning a bottom electrode layer in a MRAM structure, said bottom electrode layer is formed on a substrate including an insulation layer dielectric (ILD), comprising:
  (a) providing an array of MTJ elements on said bottom electrode layer wherein each of said MTJ elements has a bottom portion contacting the bottom electrode layer, a top portion having a top surface, and sidewalls connecting said top surface to the bottom electrode layer;
  (b) forming a spin-on carbon containing hard mask (C-SOH) on the top surface and sidewalls of the MTJ elements and on the bottom electrode layer between adjacent MTJ elements;
  (c) forming a spin-on silicon containing hard mask (Si-SOH) on the C-SOH layer;
  (d) forming a photoresist layer on the Si-SOH layer and patterning the photoresist layer to form a plurality of openings wherein there is an opening between adjacent MTJ elements;
  (e) transferring said plurality of openings through the Si-SOH layer with a first dielectric etch process and through the C-SOH layer with a second dielectric etch process;
  (f) transferring said plurality of openings through the bottom electrode layer with a metal etch process to form a patterned bottom electrode below each of the MTJ elements in said array, said metal etch includes a certain amount of overetch to remove a top portion of the ILD at the bottom of each of the plurality of openings; and (g) removing the photoresist layer following the metal etch through the bottom electrode with a stripping process that is a sequence of wet, dry, and wet stripping methods, comprising:
  (1) a first method which is a first wet strip that includes immersing or spraying the substrate with a solution including one or more organic solvents;
  (2) a dry ashing step following the first wet strip that includes exposing the substrate to an $O_2$ plasma; and
  (3) a second wet strip following the dry ashing step that includes treatment of the substrate with a water based solution.

16. The method of claim 15 wherein the first dielectric etch process is comprised of a fluorocarbon plasma.

17. The method of claim 15 wherein the second dielectric etch process is comprised of an oxygen plasma.

18. The method of claim 15 wherein the bottom electrode layer is comprised of Ta and has a thickness from about 100 to 600 Angstroms.

19. The method of claim 15 wherein transferring the plurality of openings through the bottom electrode layer is performed in a metal etch chamber with a process comprising a $Cl_2$ flow rate of about 20 to 120 sccm, a $N_2$ flow rate between about 10 and 80 sccm, a pressure from about 3 to 20 mTorr, a bias power in the range of about 20 to 100 Watts, and a source power from about 500 to 1600 Watts.

20. The method of claim 15 wherein the first wet strip consists of applying NMP maintained at a temperature between about 60° C. and 90° C. and the second wet strip comprises a water based cleaning solution maintained at a temperature of about 30° C. to 50° C.

* * * * *